United States Patent [19]
Lattimore et al.

[11] Patent Number: 6,021,512
[45] Date of Patent: *Feb. 1, 2000

[54] DATA PROCESSING SYSTEM HAVING MEMORY SUB-ARRAY REDUNDANCY AND METHOD THEREFOR

[75] Inventors: George McNeil Lattimore; Robert Paul Masleid; John Stephen Muhich, all of Austin, Tex.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/758,410

[22] Filed: Nov. 27, 1996

[51] Int. Cl.⁷ .................................................... G01R 31/28
[52] U.S. Cl. ............................................ 714/710; 365/201
[58] Field of Search ................................. 371/10.2, 10.3, 371/22.5, 40.2, 40.13; 395/182.04, 182.05, 182.09, 183.01, 183.06, 183.18; 365/230.03, 230.04, 200, 201, 230.06, 189.02; 714/710, 711, 718, 719, 733, 742, 5, 6, 7, 30

[56] References Cited

U.S. PATENT DOCUMENTS

| | | |
|---|---|---|
| 5,113,371 | 5/1992 | Hamada . |
| 5,204,836 | 4/1993 | Reed . |
| 5,301,153 | 4/1994 | Johnson . |
| 5,315,558 | 5/1994 | Hag . |
| 5,327,381 | 7/1994 | Johnson et al. . |
| 5,367,494 | 11/1994 | Shebanow et al. . |
| 5,402,377 | 3/1995 | Ohhata et al. ........................... 365/200 |
| 5,416,740 | 5/1995 | Fujita et al. ............................ 365/200 |
| 5,424,986 | 6/1995 | McClure .................................. 365/200 |
| 5,469,390 | 11/1995 | Sasaki et al. ............................ 365/200 |
| 5,491,664 | 2/1996 | Phelan ..................................... 365/200 |
| 5,495,447 | 2/1996 | Butler et al. ............................ 365/200 |
| 5,498,990 | 3/1996 | Leung et al. . |
| 5,537,665 | 7/1996 | Patel et al. .......................... 395/182.03 |
| 5,548,553 | 8/1996 | Cooper et al. ........................... 365/200 |
| 5,568,432 | 10/1996 | Wada ...................................... 365/200 |
| 5,652,725 | 7/1997 | Suma et al. .............................. 365/200 |
| 5,657,281 | 8/1997 | Rao ........................................ 365/200 |
| 5,675,543 | 10/1997 | Rieger ..................................... 365/200 |
| 5,701,270 | 12/1997 | Rao ..................................... 365/230.03 |

OTHER PUBLICATIONS

"Building Fast SRAMs With No Process 'Tricks'," *Electronics*, Aug. 7, 1986, pp. 81–83.

*Primary Examiner*—Robert W. Beausoliel, Jr.
*Assistant Examiner*—Nadeem Iqbal
*Attorney, Agent, or Firm*—Winstead Sechrest & Minick P.C.; Anthony V.S. England

[57] ABSTRACT

One or more redundant sub-arrays (324) are added to a memory (316–322) of a data processing system (300) to allow a manufacturer to compensate for defects introduced during the fabrication phase of a semiconductor device upon which it is implemented. Each of these redundant sub-arrays includes a separate and independent wordline decoder (202), bitline decoder (206), and input/output circuit (208). Furthermore, the memory to which the redundant sub-array is added is typically an on-chip memory which is organized into bit-slice sub-arrays. The bit-slice organization of the memory allows the redundant sub-array to be chained together with the on-chip memory. Data-in/data-out multiplexers are used to steer bit-slices of the data around the defective sub-arrays.

14 Claims, 7 Drawing Sheets

DATA PROCESSING SYSTEM HAVING MEMORY SUB-ARRAY REDUNDANCY AND METHOD THEREFOR

CROSS-REFERENCE TO RELATED APPLICATIONS

Related subject matter may be found in the following commonly assigned, co-pending U.S. patent applications, both of which are hereby incorporated by reference herein:

Ser. No. 08/742,221, entitled "CACHE SUB-ARRAY METHOD AND APPARATUS FOR USE IN MICROPROCESSOR INTEGRATED CIRCUITS" and filed Oct. 31, 1996; and Ser. No. 08/758,073, entitled "REDUNDANT MEMORY ARRAY" and filed concurrently herewith.

TECHNICAL FIELD

The present invention relates in general to a data processing system, and in particular, to memories within the data processing system.

BACKGROUND INFORMATION

As technology advances, memories in semiconductor devices have become more and more dense. While such compact memory provides greater functionality, cells within the semiconductor memories become more and more susceptible to the presence of defects which could impede or corrupt the flow of data within the semiconductor. Defects in semiconductor memories occur during the fabrication, packaging, and field operation of an integrated circuit. Additionally, such defects may include wafer defects, oxide defects, metalization defects, interconnect defects, contamination defects, unintended or missing connections, missing or extra contacts, and others.

To overcome the presence of defects in circuits of a semiconductor device, circuit redundancy is utilized to bypass data paths affected by a defect while preserving the original addresses of the affected data paths. For example, a memory array may include a plurality of normally-used columns of memory cells plus one or more redundant columns of memory cells. When a normally-used column is found to be defective, it is desired to discontinue use of the defective column and initiate use of a redundant column. Many devices have been provided for substituting a redundant row or block of memory cells for a faulty row or block of cells. For example, U.S. Pat. No. 5,301,153 discloses a memory array (32) which includes a column of redundant memory cells (40). A series of multiplexers are then used to determine when the data provided by the column of redundant memory cells should be used rather than data provided by the column of the normally-used memory array (34). Additionally, U.S. Pat. No. 5,204,836 discloses an apparatus for switching arrays of memory cells to correct for defects in the memory data structure. Toggle switches are used to "steer" data to one of the redundant memory cell arrays when a defect is detected.

Figure 1:
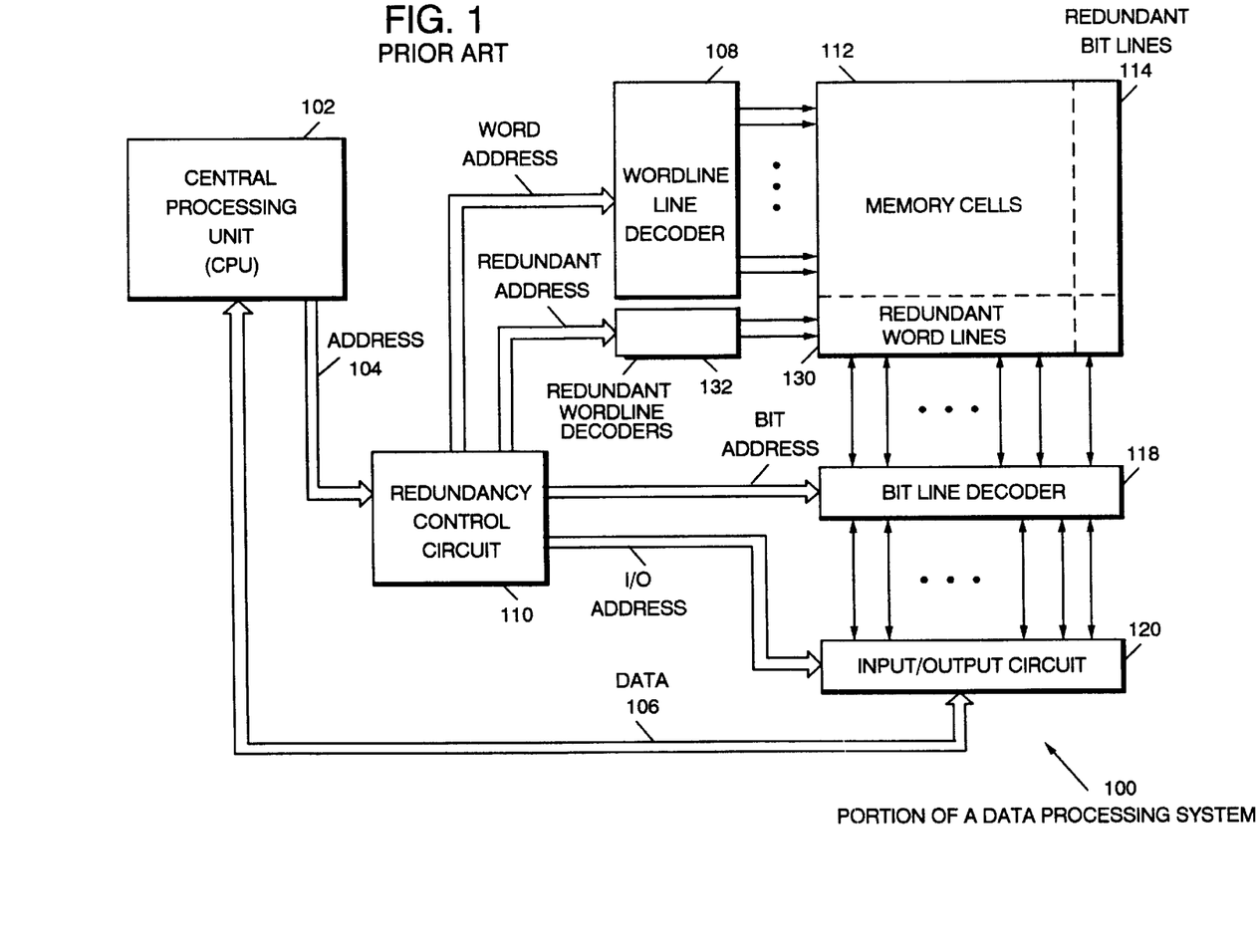
FIG. 1 illustrates, in block diagram form, a portion of a data processing system in accordance with a prior art system.

FIG. 1 illustrates a portion of a prior art data processing system 100. During operation of this prior art system, when a defect is detected in a portion of a plurality of memory cells 112, a redundancy control circuit 110 indicates that a portion of redundant wordlines 130, also called redundant rows, should be accessed rather than the originally addressed memory cells. Furthermore, redundancy control circuit 110 selects a multiplexer structure (not shown in detail herein) to output data provided by a portion of the redundant bit lines 114, also called redundant columns, upon detection of a defect. To enable the portion of redundant bitlines 114 to be accessed rather than the addressed portion of the memory cells 112, redundancy control circuit 110 provides a Bit Address signal to bitline decoder 118. An output of redundant bitlines 114 is selected by bitline decoder 118 and provided to input/output circuit 120 in place of the originally addressed memory cells.

In addition to providing redundant bitlines, prior art data processing systems also provided redundant wordlines, such as redundant wordlines 130. To enable the portion of redundant wordlines 130 to be accessed rather than the addressed portion of the memory cells 112, redundancy control circuit 110 provides a redundant address to redundant wordline decoders 132. Redundant wordline decoders 132 subsequently decode the redundant address to access redundant wordlines 130. As with the portion of redundant bitlines 114, an output of redundant wordlines 130 is provided to bitline decoder 118 and subsequently to input/output circuit 120.

It should be noted that during operation of this prior art system, wordline decoder 108 provides control signals to the wordlines running throughout the plurality of memory cells 112 and throughout redundant bit lines 114. Additionally, a same portion of bitline decoder 118 would be provided to enable a preselected portion of memory cells 112 to output data. Furthermore, in prior art data processing system 100, input/output circuit 120 is required to multiplex a data value provided by redundant bit lines 114 with each of the outputs provided by the plurality of memory cells 112 as normally accessed. While the use of redundant bitlines 114 and redundant wordlines 130 does provide some flexibility in correcting defects within memory cells 112, the use of redundant bit lines 114 and redundant wordlines 130 still requires the use of wordline decoder 108, bitline decoder 118, and input/output circuit 120. If a defect occurs in either of wordline decoder 108, bitline decoder 118, or input/output circuit 120, methods for correcting these defects are limited to defects which typically cause isolated failures along one or two wordlines or bitlines.

To correct such defects, prior art systems may implement a redundant element which includes "n" bitlines, a column decoder and a sense amp as a replacement for bitline failures. Thus, there are some methods for correcting the defects of a column decoder or a sense amp. However, due to area constraints within a semiconductor data processor, usually only a minimal number of such redundant elements are included. Furthermore, even with the use of such redundant elements, it is difficult to correct a defect in the row or column decoder unless it is unique to one row or wordline driver. For example, if there is a short between two bitlines that did not share the same sense amp, then two redundant elements would be required. As printed geometries become smaller and smaller, the capacities of reducing defect sizes does not necessarily keep pace. Therefore, large defects may cause failures in multiple cells, decoders, and sense amps. Additionally, gross scratches are generally so large that hundreds of memory cells may be impacted. Such defects may not be compensated for by the prior art systems described above.

As well, in some prior art systems, a local wordline may be used to access only a block of cells of a memory array. Thus, if the portion of the data processing system 100 illustrated in FIG. 1 included a local wordline implementation, only a portion of memory cells would be accessed when that wordline was asserted. For more information on local wordline redundancy implementations, refer to "Building Fast SRAMs With No Process 'Tricks'," published in *Electronics* in Aug. 7, 1986, pp. 81–83.

While the methodologies of the prior art implementations described herein are representative of typical redundancy techniques, these techniques have certain deficiencies. In each of these cases, the redundant cell structures are provided to correct for defects in memory cells. However, neither of these structures provides a methodology, system, or circuit for correcting defects in the circuitry controlling access to and from each of the cells in the memory array when those defects impact more than one column decoder or sense amp, or which short wires that affect the decoding of multiple rows or columns. For example, if there is a defect in a row decoder, a column decoder, or a sense amp in either of the prior art redundant circuits, the memory cells associated with those circuits may not be accessed and the semiconductor device on which they are implemented will fail.

SUMMARY OF THE INVENTION

The previously mentioned names are fulfilled with the present invention. Accordingly, there is provided, in a first form a data processing system. The data processing system includes a central processing unit for providing a plurality of address values and a plurality of data values. A memory is connected to the central processing unit for receiving the plurality of address values and communicating the plurality of data values. A redundant memory array is connected to the central processing unit for receiving the plurality of address values and selectively communicating the plurality of data values. The redundant memory array includes a plurality of memory cells and a wordline decoder connected only to the plurality of memory cells.

Additionally, there is provided, in a second form, a method for operating a data processing system. The method includes the steps of providing a plurality of address values to a redundancy control circuit, communicating a plurality of address values and a plurality of data values with a bus interface unit, enabling the redundancy control circuit to provide a redundant control signal in response to a first one of the plurality of address values, accessing a wordline decoder of a first memory when the redundant control signal has a first logic value, and accessing a wordline decoder of a redundant memory when the redundant control signal has a second logic value.

There is also provided, in a third form, a memory system which includes a memory and a redundant memory. The memory includes a first interface circuit for receiving a plurality of address values and for selectively communicating a plurality of data values, a plurality of memory cells, and a wordline decoder connected to the first interface means for selectively receiving a first one of the plurality of address values and accessing a portion of the plurality of memory cells corresponding to the first one of the plurality of address values. The redundant memory includes a second interface circuit for receiving the plurality of address values and for selectively communicating the plurality of data values and a plurality of redundant memory cells. A redundant wordline decoder is connected to the second interface means for selectively receiving the first one of the plurality of address values and accessing a portion of the plurality of redundant memory cells corresponding to the first one of the plurality of address values.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the present invention, one or more redundant sub-arrays are added to a memory of a data processing system to allow a manufacturer to compensate for defects introduced during the fabrication phase of a semiconductor device upon which it is implemented. Each of these redundant sub-arrays includes a separate and independent wordline decoder, bit-line decoder, and input/output circuit. Furthermore, in the present embodiment of the invention, the memory to which a redundant sub-array is added is typically an on-chip memory, such as a cache, which is organized into bit-slice sub-arrays. The bit-slice organization of the memory allows the redundant sub-array to be easily substituted into the memory. Data-in/data-out multiplexers are used to steer bit-slices of the data around the defective sub-arrays. Detection of defective sub-arrays and operation of the multiplexers to steer around such defective circuits are well-known in the data processing art and will not be described in detail herein. Furthermore, it should be noted that the present invention also applies to memories which do not have a bit-slice organization and memories which are implemented off-chip. Operation of both types of memories will subsequently be described in greater detail.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Description of Connectivity

A description of connectivity for each of the illustrated embodiments of the present invention will now be described. It should be noted that operation of each of these figures will be subsequently described in greater detail.

Figure 2:
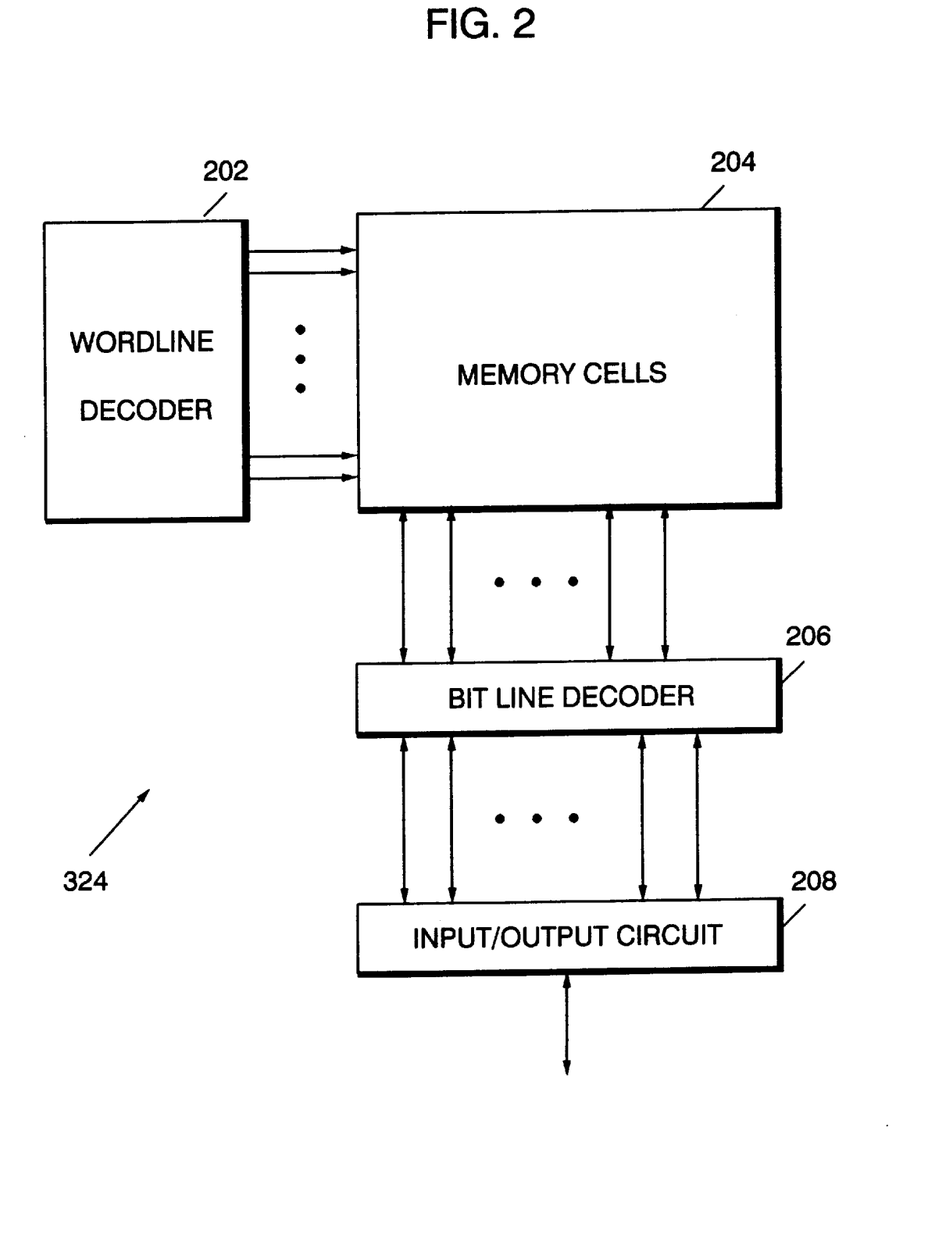
FIG. 2 illustrates, in block diagram form, a sub-array in accordance with the present invention.

FIG. 2 illustrates a sub-array 324 in greater detail. Sub-array 324 comprises a wordline decoder 202, a plurality of memory cells 204, a bitline decoder 206, and an input/output circuit 208. Wordline decoder 202 is coupled to memory cells 204 to provide a plurality of decoded data. Additionally, bitline decoder 206 is coupled to the plurality of memory cells 204 to communicate data which has been decoded or will be decoded. Input/output circuit 208 is coupled to bitline decoder 206 to communicate data with bitline decoder 206 and to determine a value which corresponds to that data. It should be noted that the structure of sub-array 324 is substantially the same as that for each of the other sub-arrays illustrated herein. Specifically, it should be noted that each sub-array includes a wordline decoder, a bitline decoder, and an input/output circuit.

Figure 3:
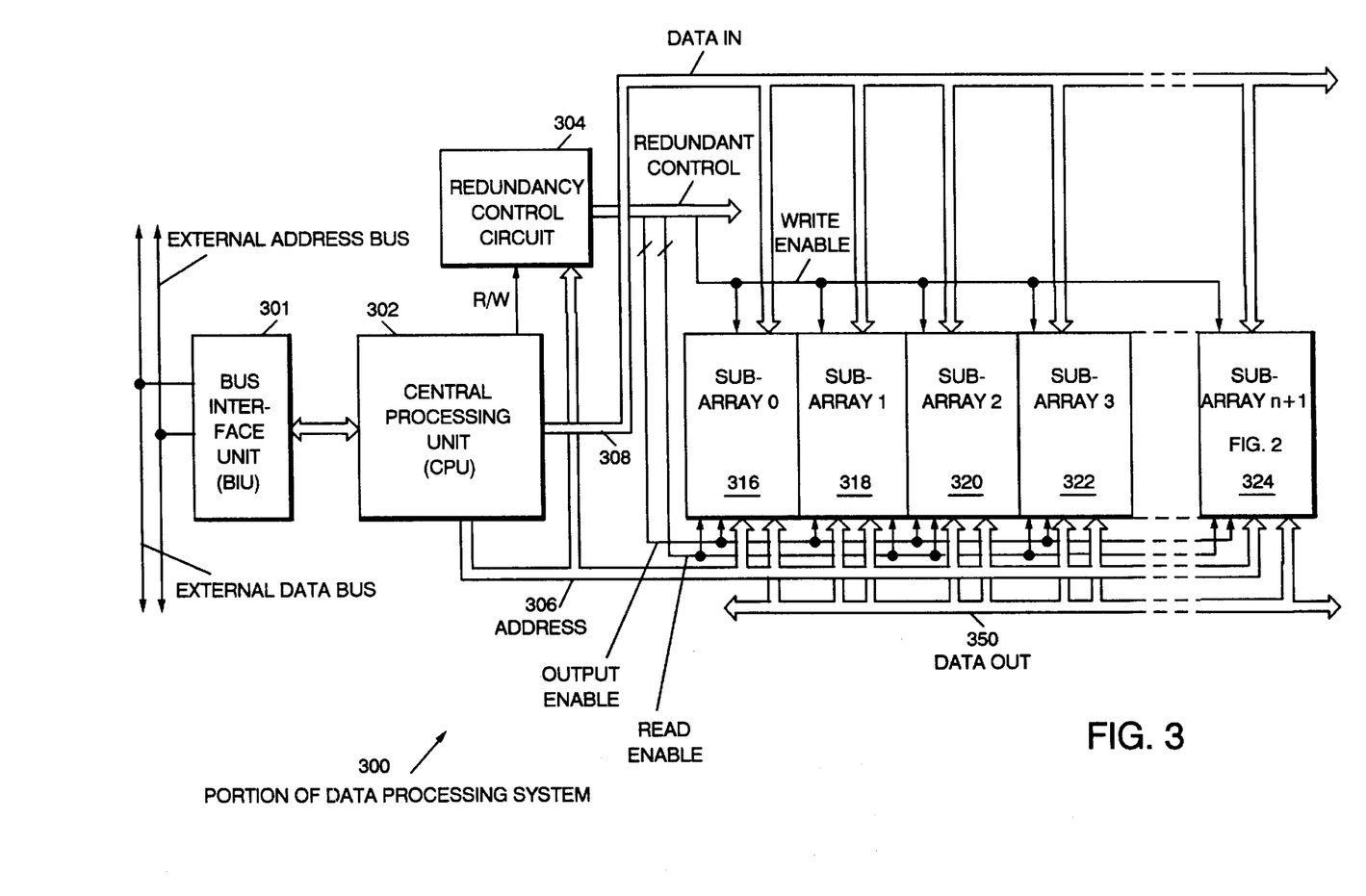
FIG. 3 illustrates, in block diagram form, a first embodiment of a data processing system in accordance with the present invention.

FIG. 3 illustrates a portion of data processing system 300. Data processing system 300 includes a central processing unit (CPU) 302, a redundancy control circuit 304 and a plurality of sub-arrays 0 through n+1 316–324. An External Address bus and an External Data bus provide information to bus interface unit (BIU) 301 which passes the information to CPU 302. In the portion of data processing system 300 illustrated in FIG. 3, CPU 302 communicates information via a Data In bus 308 and an address bus 306. CPU 302 is coupled to each of sub-array 0 316 through sub-array n+1 324 via Data In bus 308. Additionally CPU 302 is coupled to each of sub-array 0 316 through sub-array n+1 324 via Data Out bus 350. CPU 302 is also coupled to redundancy control circuit 304 to provide a Read/Write (R/W) signal. Redundancy control circuit 304 is coupled to each of sub-array 0 316 through sub-array n+1 324 to provide a write enable signal and a read enable signal. Additionally, redundancy control circuit 304 is coupled to each of sub-array 0 316 through sub-array n+1 324 to provide an output enable signal.

Figure 4:
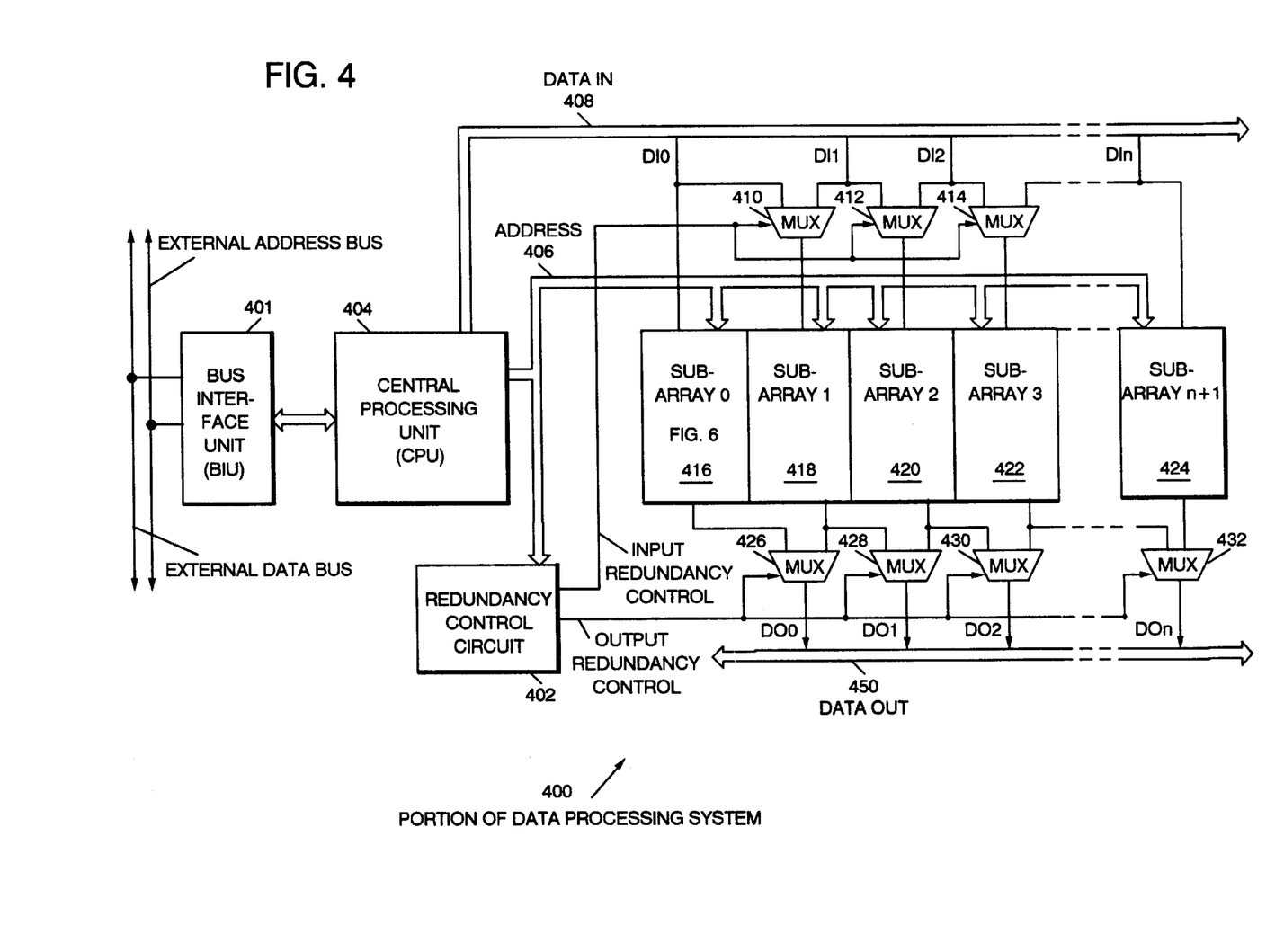
FIG. 4 illustrates, in block diagram form, a second embodiment of a data processing system in accordance with the present invention.

FIG. 4 illustrates another embodiment of the present invention. In FIG. 4, a portion of a data processing system 400 is illustrated. Data processing system 400 comprises a Bus Interface Unit (BIU) 401, a CPU 404, a multiplexer 410, a multiplexer 412, a multiplexer 414, a sub-array 0 416, a sub-array 1 418, a sub-array 2 420, a sub-array 3 422, through a sub-array n+1 424, a multiplexer 426, a multiplexer 428, a multiplexer 430, through a multiplexer 432, and a redundancy control circuit 402. BIU 401 is coupled to an External Address bus and an External Data bus. BIU 401 is coupled to CPU 404. CPU 404 is coupled to sub-array 0 416 and multiplexer 410 via Data In Bus 408 to provide a DI0 signal. Additionally, CPU 404 is coupled to multiplexer 410 and multiplexer 412 via Data In Bus 408 to provide a DI1 signal. CPU 404 is similarly coupled to multiplexer 412 and multiplexer 414 via Data In Bus 408 to provide a DI2 signal. Furthermore, CPU 404 is coupled to sub-array n+1 424 via Data In Bus 408 to provide a DIn signal thereto. Additionally, it should be noted that while a connection of the DIn signal to a previous sub-array is not illustrated herein, it is known and indicated by notation within the drawing that the DIn signal is provided to such a previous sub-array. Data Out Bus 450 is coupled to multiplexer 426 to receive the DO0 signal, to multiplexer 428 to receive a DO1 signal, to multiplexer 430 to receive a DO2 signal, and to multiplexer 432 to receive a DOn signal. CPU 404 also provides address bus 406 to each of redundancy control circuit 402, sub-array 0 416, sub-array 1 418, sub-array 2 420, sub-array 3 422, and sub-array n+1 424. Redundancy control circuit 402 is coupled to each of multiplexers 410, 412, and 414 to provide an input redundancy control signal. Additionally, redundancy control circuit 402 is coupled to each of multiplexers 426, 428, 430, and 432 to provide an output redundancy control signal. Multiplexer 410 is coupled to sub-array 1 418 to provide one of the DI0 and DI1 signals. Similarly, multiplexer 412 is coupled to sub-array 2 420 and multiplexer 414 is coupled to sub-array 3 422. Sub-array 0 416 provides a first input to multiplexer 426. Sub-array 1 418 provides the second input to multiplexer 426 and a first input to multiplexer 428. Sub-array 2 420 provides a second input to multiplexer 428 and a first input to multiplexer 430. Sub-array 3 422 provides a second input to multiplexer 430 and a first input to a subsequent multiplexer (not shown herein). Similarly, sub-array n+1 424 provides a first input to multiplexer 432. Multiplexer 426 provides the DO0 signal. Similarly, multiplexer 428 provides the DO1 signal, multiplexer 430 provides the DO2 signal, and multiplexer 432 provides the DOn signal to a Data Out Bus 450.

Figure 5:
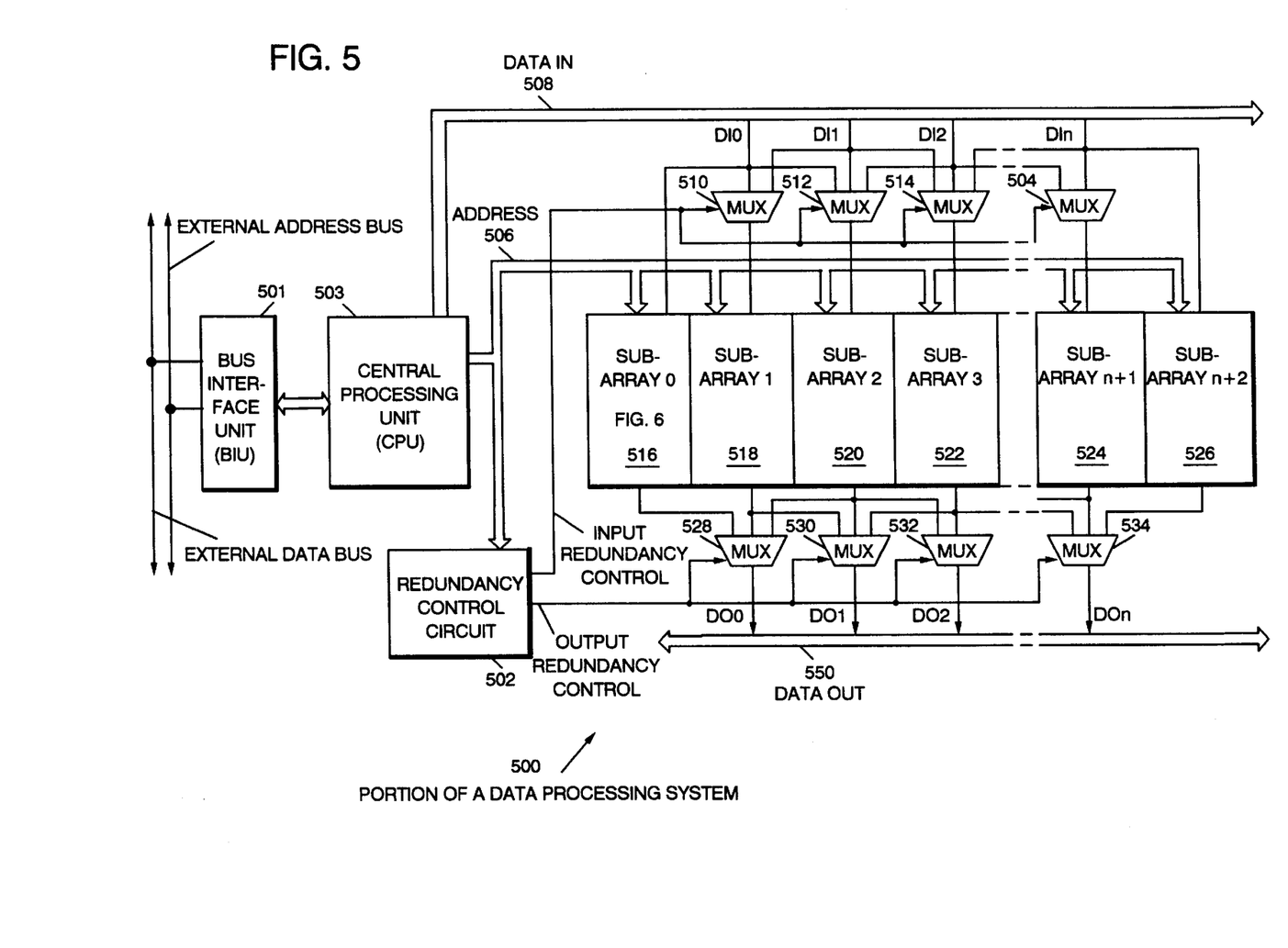
FIG. 5 illustrates, in block diagram form, a third embodiment of a data processing system in accordance with the present invention.

FIG. 5 illustrates an alternate embodiment of the present invention in a portion of a data processing system 500. The portion of data processing system 500 comprises a BIU 501, a CPU 503, a multiplexer 510, a multiplexer 512, a multiplexer 514, a multiplexer 504, a sub-array 0 516, a sub-array 1 518, a sub-array 2 520, a sub-array 3 522, a sub-array n+1 524, a sub-array n+2 526, a multiplexer 528, a multiplexer 530, multiplexer 532, multiplexer 534, and a redundancy control circuit 502. BIU 501 is coupled to an External Address bus, an External Data bus, and CPU 503. CPU 503 is coupled to sub-array 516, a first input of multiplexer 510, and a first input of multiplexer 512 to provide a DI0 signal via Data In bus 508. CPU 503 is coupled to a second input of multiplexer 510, a second input of multiplexer 512, and a first input of multiplexer 514 to provide a DI1 signal via Data In bus 508. CPU 503 is coupled to a third input of multiplexer 512, a second input of multiplexer 514 and an input of a subsequent multiplexer (not illustrated herein) to provide a DI2 signal via Data In bus 508. CPU 503 is also coupled to a second input of multiplexer 504 and sub-array n+2 526 to provide a DIn signal via Data In bus 508. Additionally, CPU 503 is coupled to multiplexer 528 to receive a DO0 signal, to multiplexer 530 to receive a DO1 signal, to multiplexer 532 to receive a DO2 signal, and to multiplexer 534 to receive a DOn signal. CPU 503 is coupled to redundancy control circuit 502, sub-array 0 516, sub-array 1 518, sub-array 2 520, sub-array 3 522, sub-array n+1 524, and sub-array n+2 526 via address bus 506. Redundancy control circuit 502 is coupled to each of multiplexers 510, 512, 514, and 504 to provide an input redundancy control signal. Additionally, redundancy control circuit 502 is coupled to each of multiplexers 528, 530, 552, and 534 to provide an output redundancy control signal.

An output of multiplexer 510 is coupled to sub-array 1 518. Likewise, an output of multiplexer 512 is coupled to sub-array 2 520, an output of multiplexer 514 is coupled to sub-array 3 522, and an output of multiplexer 504 is coupled to sub-array n+1 524. Sub-array 0 516 provides a first input to multiplexer 528. Sub-array 1 518 provides a second input to multiplexer 528 and a first input to multiplexer 530. Sub-array 2 520 provides a third input to multiplexer 528, a second input to multiplexer 530, and a first input to multiplexer 532. Sub-array 3 522 provides a third input to multiplexer 530, a second input to multiplexer 532 and a first input to a subsequent multiplexer (not illustrated herein). Likewise, sub-array n+1 524 provides a first input to multiplexer 534, as well as inputs to other previous multiplexers not illustrated herein. Sub-array n+2 526 provides a second input to multiplexer 534. Multiplexer 528 provides a DO0 output. As well, multiplexer 530 provides a DO1 signal, multiplexer 582 provides a DO2 signal, a multiplexer 534 provides a DOn signal. Each of the DO0 through DOn signals is provided to Data Out bus 550.

Figure 6:
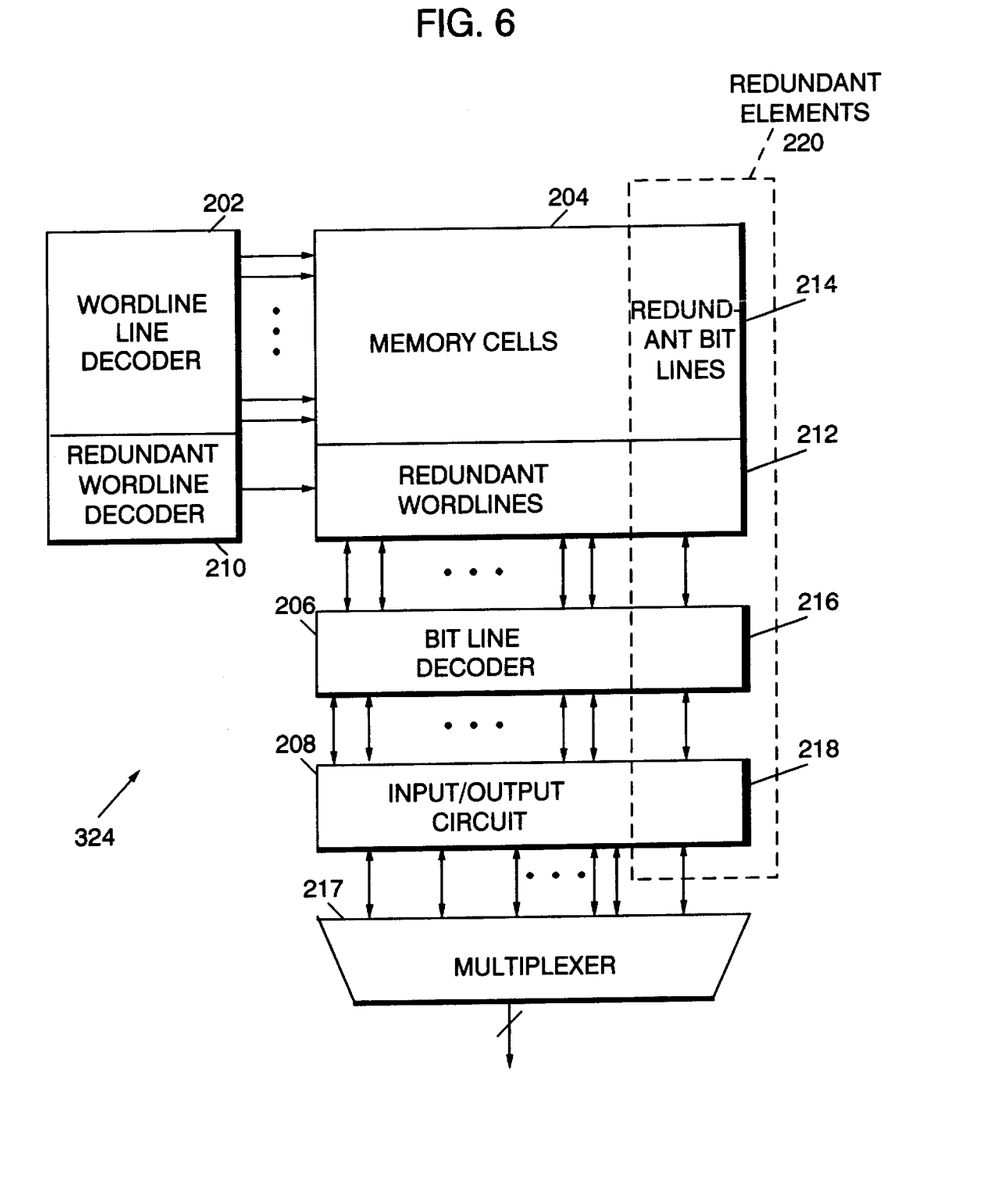
FIG. 6 illustrates, in block diagram form, a second embodiment of a sub-array in accordance with the present invention.

FIG. 6 illustrates a second embodiment of sub-array 324 in greater detail. Sub-array 324 comprises a wordline decoder 202, a plurality of memory cells 204, a bitline decoder 206, an input/output circuit 208, a redundant wordline decoder 210, a plurality of redundant wordlines 212, a plurality of redundant bitlines 214, a redundant portion of bitline decoder 216, a redundant portion of input/output circuit 218, and a multiplexer 217. It should be noted that the plurality of redundant bitlines 214, the portion of bitline decoder 216, and the portion of input/output circuit 218 comprise redundant element 220.

Operation of the present invention using the configurations illustrated herein and described above will subsequently be described in greater detail.

Description of Operation

In contrast to prior art systems which are generally limited to correcting only memory cells, the present invention provides a data processing system and methodology for compensating for defective decoding and input/output circuitry of a memory device. The present invention provides greater flexibility by implementing redundant sub-arrays which are independent and capable of performing autonomous decoding, reading, and writing operations.

Before describing operation of the present invention in greater detail, a function of redundant circuits in a memory will be described. It is common in the semiconductor industry to conduct a variety of tests, including checking for defects in memory arrays, before they are used in memory systems and are transferred to an end-user. In one prior art method, a computer system would self-test its memory upon every power-on sequence. When defective memory arrays were detected, software in the power-on sequence would determine if the defective array could be bypassed or repaired within the parameters of the redundancy scheme. Assuming the defective arrays could be repaired or bypassed, an address required to implement the alternative routing would be stored in a register so that the transfer of data into and out of the memory system could be diverted to non-defective redundant memory arrays. In an alternative prior art method, the integrity of a memory array is tested while the integrated circuit upon which it is implemented is still in a wafer form. Wafer probe equipment, known in the data processing art, probes the individual memory array using a software test program to determine whether or not a particular redundancy scheme can be successfully applied to bypass a defective memory array. If the redundancy scheme can be successfully applied, the location of the defective memory array is identified through the use of fuses which are typically "blown" using a laser. The use of these prior art techniques is well-known in the data processing art and will not be described in further detail herein.

FIG. 2 illustrates a structure of each of the sub-arrays of the present invention. In each of these sub-arrays of the present invention, a plurality of memory cells is controlled by a separate and autonomous wordline decoder, bitline decoder, and input/output circuit. As illustrated and described in detail above, in the present invention, one or more redundant sub-arrays are added to a memory of a data processing system to allow a manufacturer to compensate for defects introduced during fabrication of the semiconductor device upon which it is implemented. Each of these redundant sub-arrays includes a separate and independent wordline decoder, bitline decoder, and input/output circuit. Thus, by using the redundant sub-array structure of the present invention, defects in wordline decoders, bitline decoders, and input/output circuits may be corrected in the present invention. This contrasts with the prior art systems which are limited to correcting only defects which impact a minimal number of memory cells and support circuits.

Referring again to FIG. 3, assuming that a defective memory array has already been detected, operation of data processing system 300 will now be described. During operation, external address and data information is provided to bus interface unit 301 via an External Address bus and an External Data bus, respectively. BIU 301 subsequently passes this information to CPU 302, where it is processed and may be used to access sub-array 0 316 through sub-array n+1 324. Additionally, it should be noted that one with skill in the art will recognize that CPU 302 could be used to access other devices not illustrated herein, but which are included in a remaining portion of data processing system 300.

When CPU 302 receives information from BIU 301 which requires it to access sub-array 0 316 through sub-array n+1 324, CPU 302 provides a required address value to each of sub-array 0 316 through sub-array n+1 324 via address bus 306. Additionally, CPU 302 provides the required address value to redundancy control circuit 304.

As previously mentioned, redundancy control circuit 304 may be implemented either as a register which stores an alternative routing address when the requested address would access a defective memory cell or as a series of fuses which effectively re-route the required address to another redundant memory cell when the required address would access a defective memory cell. During operation, redundancy control circuit 304 determines whether the required address should be re-routed by comparing it with the address identified by the fuses or the registers. As previously mentioned, the functions performed by redundancy control circuit 304 are well-known in the data processing art and will not be described in detail herein.

Assume in a first example of operation of data processing system 300 that the address required by CPU 302 accesses a defective memory location in sub-array 1 318. The locations of defects in sub-array 1 318 were previously identified and the appropriate information was relayed to redundancy control circuit 304. Therefore, when the required address is accessed and after receipt of the R/$\overline{W}$ signal, redundancy control circuit 304 will recognize that a defective memory location has been accessed and re-route data to sub-array (n+1) 324. In this example, assume that a D1 data value is desired to be read from or written to sub-array 1 318. Therefore, as redundancy control circuit 304 recognizes that sub-array 1 318 is defective, redundancy control circuit 304 provides an appropriate one of the write enable signal, the read enable signal, and the output enable signal to sub-array n+1 324. Likewise, redundancy control circuit 304 prevents a read enable, write enable, or output enable signal from being provided to sub-array 1 318. For example, if the D1 data value is to be written to sub-array 1 318, but may not be done because sub-array 1 318 is defective, redundant control circuit 304 selectively asserts a write enable signal to enable sub-array 324 to be accessed and the data value D1 written therein. Additionally, when data is attempted to be accessed from sub-array 1 318, redundancy control circuit 304 selectively asserts the output enable signal corresponding to sub-array n+1 324 and negates the output enable signal provided to sub-array 1 318 so that the data is output from sub-array n+1 324 and not from sub-array 1 318. Additionally, in the portion of data processing system 300 illustrated in FIG. 3, Data Out bus 350 is driven by drivers of sub-array n+1 324 (not illustrated in detail herein). Drivers associated with a remaining portion of the plurality of sub-arrays are selectively tri-stated. It should be also noted that a multiplexer could be used instead of the tri-stated buses to select a data value to be output from the memory cells described herein.

The example illustrated in FIG. 3 includes a memory which does not have a bit slice structure and which takes advantage of a structure of both redundant sub-array n+1 324 and each of the plurality of sub-arrays 316 through 322. As illustrated in FIG. 2, redundant sub-array n+1 324 includes a separate and independent wordline decoder 202, bitline decoder 206 and input/output circuit 208. Because redundant sub-array n+1 324, as well as each of sub-arrays 316 through 322, include this separate and autonomous wordline decoder, bitline decoder, and input/output circuit, a defect in a wordline decoder, a bitline decoder, or an input/output circuit of any of the sub-arrays may be corrected through the use of redundant sub-array n+1 324. By using the flexible structure of redundant sub-array n+1 324, data to be input to a defective memory array may be rerouted and correctly processed, even when the defect in the memory array is a result of a defective decoder or sensing of an input/output circuit. This ability contrasts with prior art systems in which a single wordline decoder and a single bitline decoder are used for all memory cells, including those of a redundant array. In such prior art implementations, defects in a wordline decoder which affect multiple cells, decoders, or sense amps cannot be compensated for and will result in a total failure of the memory array.

FIG. 4 illustrates an alternative embodiment of the present invention in a portion of data processing system 400. In FIG. 4, a memory having a bit slice structure is implemented. Data processing system 400, as illustrated in FIG. 4, includes multiplexers of both the inputs and outputs of each of the plurality of sub-arrays and redundant sub-array n+1 424. The use of multiplexers at the input of each of the plurality of sub-arrays allows input data to be routed to a functioning portion of memory before being decoded by the wordline and bitline decoders of each the plurality of sub-arrays and, where necessary, the redundant sub-array n+1 424. The multiplexers at the outputs of each of the plurality of sub-arrays allow a correct data value to be output from the plurality of sub-arrays and, where necessary, redundant sub-array n+1 424.

Operation of data processing system 400 of FIG. 4 will be described briefly herein. As previously mentioned, FIG. 4 illustrates a bit slice organization in which all sub-arrays must be used to concurrently access bits of a data value, except for one sub-array. To describe operation of data processing system 400, assume that a defective memory array has already been detected and that memory array is sub-array 1 418. When CPU 404 receives information from BIU 401 which requires it to access sub-arrays 0 416 through sub-array n+1 424, CPU 404 provides a required address value to each of sub-array 0 416 through sub-array n+1 424 via address bus 406. Additionally, CPU 404 provides the required address value to redundancy control circuit 402. When the address required by CPU 404 accesses a defective memory location in sub-array 1 418, redundancy control circuit 402 recognizes that a defective memory location has been accessed and re-routes the data accordingly. In this example, the D0 data value would still be provided to sub-array 0 416 because sub-array 0 416 is functioning correctly. However, for sub-array 1 418, the data value DI1, which would typically be provided thereto, may not be so provided because sub-array 1 418 is defective. The redundancy control circuit 402 recognizes that sub-array 1 418 is defective, redundancy control circuit 402 provides an input redundancy control signal to multiplexers 410 and 412. The input redundancy control circuit signal disables multiplexer 410 and enables multiplexer 412 to provide DI1 data value to sub-array 2 420. Subsequently, each of the data values which are accessed corresponding to the requested address are shifted to the right and provided to a next sub-array. Therefore, data value DI2 is provided to sub-array 3 422 via multiplexer 414 and data value DIn is provided to sub-array n+1 424.

Additionally, at an output, when sub-array 1 418 is defective, redundancy control circuit 402 enables multiplexer 426 to access data provided by sub-array 0 416 and provided as the DO0 signal. Additionally, redundancy control circuit 402 enables multiplexer 428 to access data output from sub-array 2 420 and provide that value as a DO1 value because the data output from sub-array 1 418 would be erroneous. Consequently, each of the data values which are accessed corresponding to the requested address are shifted to the right and provided as a next data value. Therefore, data value DO2 is provided from sub-array 3 422 via multiplexer 430 and data value DOn is provided from sub-array n+1 424 via multiplexer 432.

FIG. 5 illustrates an embodiment of the present invention which utilizes two redundant sub-arrays. While the functionality control provided for the embodiment of the invention illustrated in FIG. 5 is very similar to that disclosed with respect to FIG. 4, the addition of a second redundant sub-array increases the improvement in the field of functioning data processing system in which it is implemented. For example, for one redundant sub-array added to 16 sub-arrays, the probability of a good memory is:

$$P = p^{17} + [17(p^{16}) \times (1-p)],$$

where P is the probability of at least 16 sub-arrays being good and p is the probability of an individual sub-array being good. Similarly, for two redundant sub-arrays added to 16 sub-arrays, the probability of a good memory is:

$$P = p^{18} + [(18 \times p^{17}) \times (1-p)^1 + 153(p^{16}) \times (1-p)^2],$$

where P is a probability of at least 16 sub-arrays being good and p is a probability of an individual sub-array being good. The productivity of a redundant sub-array is a function of the base defectivity, but it is comparable to the combined benefit of bitline and wordline redundancy.

FIG. 6 illustrates an alternate embodiment of the sub-arrays of the present invention. The embodiment of the invention illustrated in FIG. 6 is included herein to illustrate that the sub-arrays of the present invention may also include the redundant bitline and redundant wordline implementations disclosed in prior art applications. Thus, in each of these sub-arrays, a plurality of memory cells is controlled by a separate and autonomous wordline decoder, bitline decoder and input/output circuits. The inclusion of these independent and autonomous circuits allow a manufacturer to compensate for defects introduced during the fabrication of the semiconductor device upon which it is implemented.

Additionally, the sub-array illustrated in FIG. 6, as with that illustrated in FIG. 2, allows a manufacturer to compensate for large defects which effect multiple cells, multiple wordline decoders, and multiple bitline decoders. Additionally, the sub-array illustrated in FIG. 6 allows a user to implement redundant wordlines and redundant bitlines, to allow for the selective correction of single cell defects within a sub-array.

Furthermore, as previously mentioned, FIGS. 3, 4, and 5 illustrate a portion of a data processing system which may implement the present invention. A possible embodiment of the data processing system is illustrated in greater detail in FIG. 7.

Figure 7:
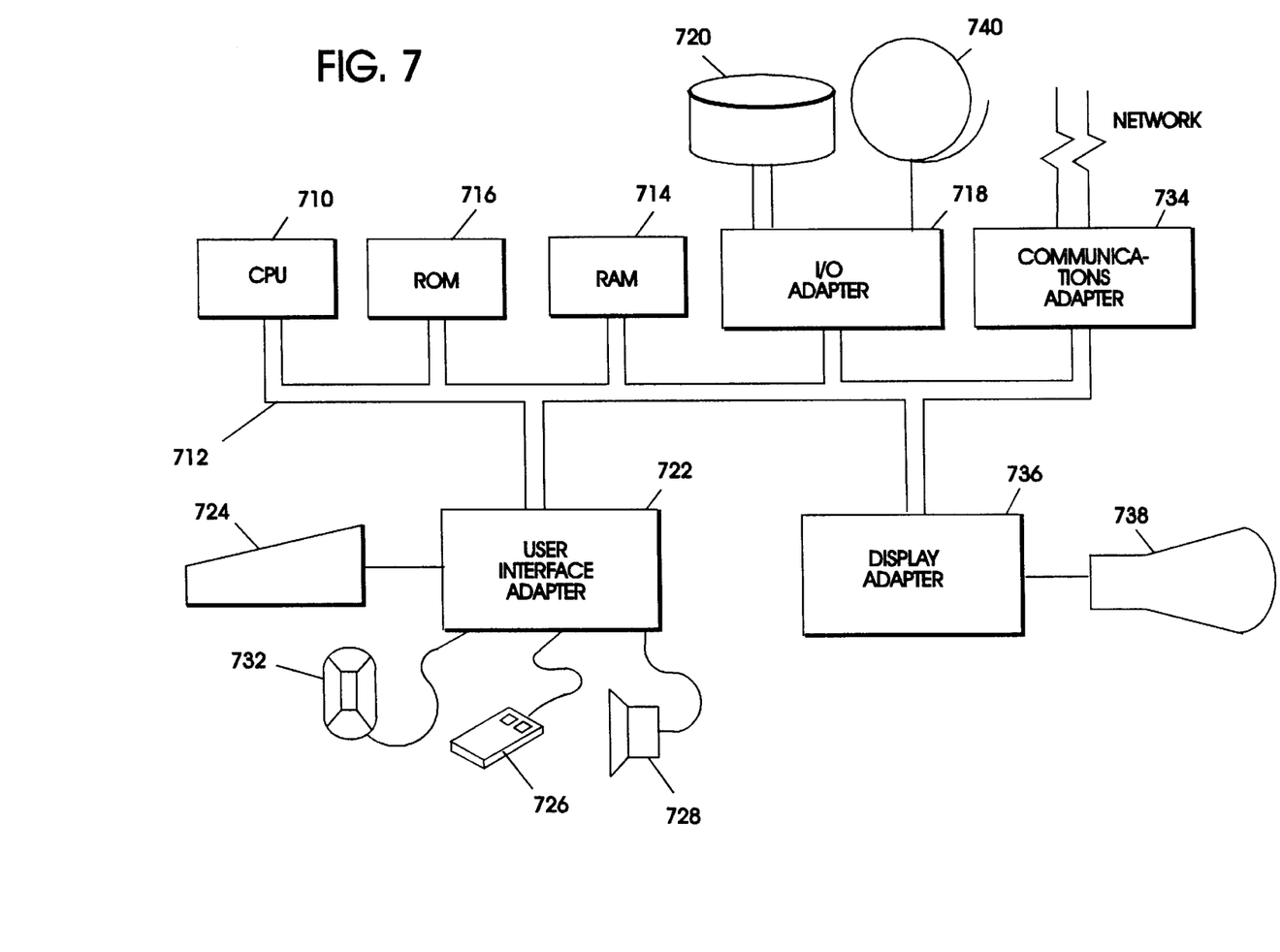
FIG. 7 illustrates, in block diagram form, an embodiment of a data processing system in accordance with the present invention.

Referring first to FIG. 7, an example is shown of a data processing system 700 which may be used for the invention. The system has a central processing unit (CPU) 710, such as a PowerPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor User's Manual", 1994, IBM Corporation, which is hereby incorporated herein by reference. The history buffer (not shown) of the present invention is included in CPU 710. The CPU 710 is coupled to various other components by system bus 712. Read only memory ("ROM") 716 is coupled to the system bus 712 and includes a basic input-output system ("BIOS") that controls certain basic functions of the data processing system 700. Random access memory ("RAM") 714, I/I adapter 718, and communications adapter 734 are also couple to the system bus 712. I/I adapter 718 may be a small computer system interface ("SCSI") adapter that communicates with a disk storage device 720. Communications adapter 734 interconnects bus 712 with an outside network enabling the data processing system to communication with other such systems. Input/Output devices are also connected to system bus 712 via user interface adapter 722 and display adapter 736. Keyboard 724, track ball 732, mouse 726 and speaker 728 are all interconnected to bus 712 via user interface adapter 722. Display monitor 738 is connected to system bus 712 by display adapter 736. In this manner, a user is capable of inputting to the system throughout the keyboard 724, trackball 732 or mouse 726 and receiving output from the system via speaker 728 and display 738. Additionally, an operating system such as AIX ("AIX" is a trademark of the IBM Corporation) is used to coordinate the functions of the various components shown in FIG. 7.

Preferred implementations of the invention include implementations as a computer system programmed to execute the method or methods previously described herein, and as a computer program product. According to the computer system implementation, sets of instructions for executing the method or methods are resident in the random accesss memory 714 of one or more computer systems configured generally as described above. Until required by the computer system, the set of instructions may be stored as a computer program product in another computer memory, for example, in disk drive 720 (which may include a removable memory such as an optical disk or floppy disk for eventual use in the disk drive 720). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting or other terms that could be associated with a human operator. However, for at least a number of the operations described herein which form part of the present invention, no action by a human operator is desirable. The operations described are, in large part, machine operations processing electrical signals to generate other electrical signals.

It should be noted that there are many additional configurations for implementing the invention described above. For example, each of the sub-arrays may be implemented as a separate off-chip memory such that a fault tolerant data processing system is created. By using self-test techniques which are inherent in the data processing system, the off-chip memories may be tested to determine if one fails. If an off-chip memory fails, the redundancy scheme described herein may be implemented.

While there have been described herein the principles of the invention, it is to be clearly understood to those skilled in the art that this description is made by way of example only and not as a limited to the scope of the invention. Accordingly, it is intended, by the appended claims, to cover all modifications of the invention which fall within the true spirit and scope of the invention.

What is claimed is:

1. A data processing system, comprising:
    a central processing unit for providing a plurality of address values and a plurality of data values;
    a memory coupled to the central processing unit for receiving the plurality of address values and communicating the plurality of data values;
    a redundant memory array coupled to the central processing unit for receiving the plurality of address values and selectively communicating the plurality of data values, the redundant memory array, comprising:
        a plurality of memory cells; and
        a wordline decoder coupled only to the plurality of memory cells; and
    a multiplexer coupled to the memory for receiving a first data value and coupled to the redundant memory array for receiving a first redundant data value, the multiplexer selectively providing one of the first data value and the first redundant data value as a data output value.

2. The data processing system of claim 1, wherein the redundant memory array further comprises:
    a bitline decoder coupled only to the plurality of memory cells.

3. The data processing system of claim 1, wherein the redundant memory array further comprises:
    an input/output circuit coupled only to the plurality of memory cells.

4. The data processing system of claim 1 wherein the memory further comprises a plurality of sub-arrays, wherein each of the plurality of sub-arrays comprises a plurality of memory cells.

5. The data processing system of claim 4 wherein each of the plurality of sub-arrays further comprises:
    a wordline decoder coupled to the plurality of memory cells.

6. The data processing system of claim 4 wherein each of the plurality of sub-arrays further comprises:

a bitline decoder coupled to the plurality of memory cells.

7. The data processing system of claim 4 wherein each of the plurality of sub-arrays further comprises:
an input/output circuit coupled to the plurality of memory cells.

8. The data processing system of claim 1 wherein the multiplexer selectively provides the first redundant data value as the data output value when the memory provides an erroneous first data value.

9. The data processing system of claim 1 wherein the multiplexer selectively provides the first redundant data value as the data output value when the memory is defective.

10. A data processing system, comprising:
a central processing unit for providing a plurality of address values and a plurality of data values;
a memory coupled to the central processing unit for receiving the plurality of address values and communicating the plurality of data values;
a redundant memory array coupled to the central processing unit for receiving the plurality of address values and selectively communicating the plurality of data values, the redundant memory array, comprising:
a plurality of memory cells; and
a wordline decoder coupled only to the plurality of memory cells;
a redundancy control circuit coupled to the central processing unit to receive the plurality of address values, the redundancy control circuit providing a redundant control signal to indicate a portion of the memory is defective; and
a multiplexer coupled to the memory for receiving a first data value, coupled to the redundant memory array for receiving a first redundant data value, and coupled to the redundancy control circuit for receiving the redundant control signal, the multiplexer providing the first data value as a data output value when the redundant control signal is in a first logic state and the multiplexer providing the first redundant data value as the data output value when the redundant control signal is in a second logic state.

11. A data processing system, comprising:
a central processing unit for providing a plurality of address values and a plurality of data values;
a memory coupled to the central processing unit for receiving the plurality of address values and communicating the plurality of data values;
a redundant memory array coupled to the central processing unit for receiving the plurality of address values and selectively communicating the plurality of data values, the redundant memory array, comprising:
a plurality of memory cells; and
a wordline decoder coupled only to the plurality of memory cells;
a redundancy control circuit coupled to the central processing unit to receive the plurality of address values, the redundancy control circuit providing a redundant control signal to indicate a portion of the memory is defective; and
a multiplexer coupled to the central processing unit for receiving the plurality of data values and coupled to the redundancy control circuit for receiving the redundant control signal, the multiplexer providing a first one of the plurality of data values to the memory when the redundant control signal is in a first logic state and providing the first one of the plurality of data values to the redundant memory array when the redundant control signal is in a second logic state.

12. A data processing system comprising:
a central processing unit for providing a plurality of address values and a plurality of data values;
a memory coupled to the central processing unit for receiving the plurality of address values and communicating the plurality of data values;
a redundant memory array coupled to the central processing unit for receiving the plurality of address values and selectively communicating the plurality of data values, the redundant memory array, comprising:
a plurality of memory cells; and
a wordline decoder coupled only to the plurality of memory cells,
wherein the redundant control signal enables the redundant memory to a stored data value when the plurality of address values correspond to the portion of the memory which is defective.

13. A method for operating a data processing system, comprising the steps of:
providing a plurality of address values and a plurality of data values;
receiving by a memory the plurality of address values and communicating the plurality of data values;
receiving by a redundant memory array the plurality of address values and selectively communicating the plurality of data values;
receiving by a multiplexer a first data value from the memory and receiving by the multiplexer a first redundant data value from the redundant memory array; and
selectively providing by the multiplexer one of the first data value and the first redundant data value as a data output value.

14. A memory system, comprising:
a memory, comprising:
first interface means for receiving a plurality of address values and for selectively communicating a plurality of data values;
a plurality of memory cells; and
a wordline decoder coupled to the first interface means for selectively receiving a first one of the plurality of address values and accessing a portion of the plurality of memory cells corresponding to the first one of the plurality of address values;
a redundant memory, comprising:
second interface means for receiving the plurality of address values and for selectively communicating the plurality of data values;
a plurality of redundant memory cells; and
a redundant wordline decoder coupled to the second interface means for selectively receiving the first one of the plurality of address values and accessing a portion of the plurality of redundant memory cells corresponding to the first one of the plurality of address values; and
a multiplexer coupled to the memory for receiving a first data value and coupled to the redundant memory array for receiving a first redundant data value, the multiplexer selectively providing one of the first data value and the first redundant data value as a data output value.

* * * * *